US 6,749,970 B2
Jun. 15, 2004

(54) METHOD OF ENHANCING CLEAR FIELD PHASE SHIFT MASKS WITH BORDER REGIONS AROUND PHASE 0 AND PHASE 180 REGIONS

(75) Inventors: Todd P. Lukanc, San Jose, CA (US); Christopher A. Spence, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 204 days.

(21) Appl. No.: 10/016,273

(22) Filed: Dec. 11, 2001

(65) Prior Publication Data

US 2004/0009407 A1 Jan. 15, 2004

(51) Int. Cl.⁷ ................................................. G03F 9/00
(52) U.S. Cl. ............................................................. 430/5
(58) Field of Search ............................. 430/6; 716/19, 716/20, 21

(56) References Cited

U.S. PATENT DOCUMENTS

| | | | |
|---|---|---|---|
| 5,328,784 A | 7/1994 | Fukuda | 430/5 |
| 5,521,031 A | 5/1996 | Tennant et al. | |
| 5,573,890 A | 11/1996 | Spence | 430/311 |
| 5,619,059 A | 4/1997 | Li et al. | 257/431 |
| 5,641,593 A | 6/1997 | Watanabe et al. | 430/5 |
| 5,766,806 A | 6/1998 | Spence | |
| 5,780,187 A | 7/1998 | Pierrat | 430/5 |
| 5,807,649 A | 9/1998 | Liebmann et al. | 430/5 |
| 5,858,580 A | 1/1999 | Wang et al. | 430/5 |
| 5,861,233 A | 1/1999 | Sekine et al. | 430/296 |
| 6,013,399 A | 1/2000 | Nguyen | 430/5 |
| 6,057,063 A * | 5/2000 | Liebmann et al. | 430/5 |
| 6,228,539 B1 | 5/2001 | Wang et al. | 430/5 |
| 6,410,193 B1 | 6/2002 | Stivers et al. | 430/5 |
| 6,534,224 B2 | 3/2003 | Lukanc | 430/5 |

FOREIGN PATENT DOCUMENTS

| | | |
|---|---|---|
| EP | 0 708 367 B1 | 1/1998 |
| WO | WO 01/23961 A1 | 4/2001 |

OTHER PUBLICATIONS

T. Brunner et al., "170 nm gates fabricated by phase–shift mask and top anti–reflector process," 182/SPIE vol. 1927, Optical/Laser Microlithography VI, 1993, pps. 1–8.

Kurt Ronse et al., "Comparison of various phase shift strategies and application to 0.35 μm ASIC Designs," 2/SPIE vol, 1927, Optical/Laser Microlithography VI, 1993, pps. 1–15.

J. M. Calvert et al., "Projection X–Ray Lithography With Ultrathin Imaging Layers and Selective Electroless Metallization," Optical Engineering vol. 32 No. 10, Oct. 1993., pp. 2437–2445.

H. Kyuragi et al., "Synchrotron Radiation–Excited Chemical Vapor Deposition of Silicon Nitride Films from a $SiH_4 + NH_3$ Gas Mixture," Journal of the Electrochemical Society, vol. 138 Nov. 11 1991, pp. 3412–3416.

Y. Matsui et al., "Low–Temperature Growth of $SiO_2$ Thin Film by Photo–Induced Chemical Vapor Deposition Using Synchrotron Radiation," Japanese Journal of Applied Physics, Part I, vol. 31 n.6B, Jun. 1992, pp. 1972–1978.

(List continued on next page.)

Primary Examiner—S. Rosasco
(74) Attorney, Agent, or Firm—Foley & Lardner LLP

(57) ABSTRACT

A technique in which a first boundary region is added to the ends of phase zero (0) pattern defining polygons and a second boundary region is added to the ends of phase 180 pattern. This technique can improve line end pattern definition and improve the manufacturability and patterning process window. The added boundary region balances the light on both sides of the line ends, resulting in a more predictable final resist pattern.

24 Claims, 5 Drawing Sheets

OTHER PUBLICATIONS

J. F. Moore et al., "Deposition of Dielectric Thin Films by Irradiation of Condensed Reactant Mixtures," Materials Research Society Symposium Proceedings, vol. 335, 1994, pp. 81–86.

I. Nishiyama et al., "Photon Energy Dependence of Synchrofron Radiation Induced Growth Suppression and Initiation in Al Chemical Vapor Deposition II. Surface Analysis by Auger Electron Spectroscopy," Applied Surface Science, vol. 103, 1996, pp. 299–306.

O. R. Wood II et al., "Use of Attenuated Phase Masks in Extreme Ultraviolet Lithography," Journal of Vacuum Science and Technology B, vol. 15, No. 6, Nov./Dec. 1997, pp. 2448–2451.

R. Zanoni et al., "Synchrotron–Radiation–Stimulated Tungsten Deposition on Silicon from $W(CO)_6$," Journal of Vacuum Science and Technology A, vol. 9, No. 3, May/Jun. 1991, pp. 931–934.

Chen HL et al., "Simulation on a New Reflection Type Attenuated Phase Shifting Mask for Extreme Ultraviolet Lithography", Emerging Lithographic Technologies III, Santa Clara, CA, USA, Mar. 15–17, 1999, vol. 3676, pp. 578–586, XP002230586, Proceedings of the SPIE—The International Society for Optical Engineering, 1999, SPIE—Int. Soc. Opt. Eng., USA.

Levenson et al., "Improving Resolution in Photolithography with a Phase–Shifting Mask," IEEE Transactions on Electron Devices, vol. ED–29, No. 12, Dec. 1982, pp. 1828–1836.

Lin, B. J., "Phase–Shifting Masks Gain an Edge," Circuits & Devices, Mar. 1993, pp. 28–35.

PCT International Search Report, International Application No. PCT/US 02/41466, International Filing Date Sep. 12, 2002 (6 pages).

U.S. application Ser. No. 09/772,577, now U.S. patent 6,534,224 entitled "Phase Shift Mask and System and Method for Making the Same" by Lukanc.

* cited by examiner

METHOD OF ENHANCING CLEAR FIELD PHASE SHIFT MASKS WITH BORDER REGIONS AROUND PHASE 0 AND PHASE 180 REGIONS

CROSS REFERENCE TO RELATED APPLICATIONS

This application is related to U.S. patent application Ser. No. 10/016,439, Attorney Docket No. 39153/447 (G1152), entitled METHOD OF EXTENDING THE AREAS OF CLEAR FIELD PHASE SHIFT GENERATION; U.S. patent application Ser. No. 10/016,710, Attorney Docket No. 39153/448 (G1153), entitled METHOD OF ENHANCING CLEAR FIELD PHASE SHIFT MASKS WITH CHROME BORDER AROUND PHASE 180 REGIONS; U.S. patent application Ser. No. 10/016,702, Attorney Docket No. 39153/449 (G1154), entitled METHOD OF ENHANCING CLEAR FIELD PHASE SHIFT MASKS BY ADDING PARALLEL LINE TO PHASE 0 REGION; and U.S. patent application Ser. No. 10/016,441, Attorney Docket No. 39153/451 (G1156), entitled METHOD OF ENHANCING CLEAR FIELD PHASE SHIFT MASKS WITH BORDER AROUND OUTSIDE EDGES OF PHASE ZERO REGIONS, all of which are assigned to the same assignee as the present application.

FIELD OF THE INVENTION

The present invention relates generally to integrated circuits and methods of manufacturing integrated circuits. More particularly, the present invention relates to generating phase shifting patterns to improve the patterning of gates and other layers, structures, or regions needing sub-nominal dimensions.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC.

One limitation to achieving smaller sizes of IC device features is the capability of conventional lithography. Lithography is the process by which a pattern or image is transferred from one medium to another. Conventional IC lithography uses ultra-violet (UV) sensitive photoresist. Ultra-violet light is projected to the photoresist through a reticle or mask to create device patterns on an IC. Conventional IC lithographic processes are limited in their ability to print small features, such as contacts, trenches, polysilicon lines or gate structures.

Generally, conventional lithographic processes (e.g., projection lithography and EUV lithography) do not have sufficient resolution and accuracy to consistently fabricate small features of minimum size. Resolution can be adversely impacted by a number of phenomena including: diffraction of light, lens aberrations, mechanical stability, contamination, optical properties of resist material, resist contrast, resist swelling, thermal flow of resist, etc. As such, the critical dimensions of contacts, trenches, gates, and, thus, IC devices, are limited in how small they can be.

For example, at integrated circuit design feature sizes of 0.5 microns or less, the best resolution for optical lithography technique requires a maximum obtainable numerical aperture (NA) of the lens systems. Superior focus cannot be obtained when good resolution is obtained and vice versa because the depth of field of the lens system is inversely proportional to the NA and the surface of the integrated circuit cannot be optically flat. Consequently, as the minimum realizable dimension is reduced in manufacturing processes for semiconductors, the limits of conventional optical lithography technology are being reached. In particular, as the minimum dimension approaches 0.1 microns, traditional optical lithography techniques may not work effectively.

With the desire of reducing feature size, integrated circuit (IC) manufacturers established a technique called "phase shifting." In phase shifting, destructive interference caused by two adjacent translucent areas in an optical lithography mask is used to create an unexposed area on the photoresist layer. Phase shifting exploits a phenomenon in which light passing through translucent regions on a mask exhibits a wave characteristic such that the phase of the light exiting from the mask material is a function of the distance the light travels through the mask material. This distance is equal to the thickness of the mask material.

Phase shifting allows for an enhancement of the quality of the image produced by a mask. A desired unexposed area on the photoresist layer can be produced through the interference of light from adjacent translucent areas having the property that the phase of the light passing through adjacent apertures is shifted by 180 degrees relative to each other. A dark, unexposed area will be formed on the photoresist layer along the boundary of the phase shifted areas caused by the destructive interference of the light which passes through them.

Phase shifting masks are well known and have been employed in various configurations as set out by B. J. Lin in the article, "Phase-Shifting Masks Gain an Edge," Circuits and Devices, March 1993, pp. 28–35. The configuration described above has been called alternating phase shift masking (PSM).

In some cases, phase shifting algorithms employed to design phase shifting masks define a phase shifting area that extends just beyond active regions of an active layer. The remaining length of polysilicon, for example, is typically defined by a field or trim mask. However, this approach is not without its problems. For example, alignment offsets between phase shift masks and field masks may result in kinks or pinched regions in the polysilicon lines as they transition from the phase shifting area to the field mask areas. Also, since the field masks are employed to print the dense, narrow lines of polysilicon beyond the active regions, the field masks become as critical and exacting as the phase shift masks.

Phase shift patterning of polysilicon or "poly" layouts has been proven to be an enhancement in both manufacturing as well as enabling smaller patterned lines and narrow pitches. These items can be more enhanced as the desired linewidth and pitch shrinks, yet there can be some risks and complications.

Conventional patterning with phase shifters has been done by shifting only the areas of minimum desired dimensions—usually the poly gate or narrow poly that is over the active pattern. The patterned poly lines that are away from the active regions are usually laid out with similar design rules as that of the patterned poly lines on active regions. As such, there can be many transitions between the phase shifted patterning and binary patterning. Transition areas can result in linewidth loss, increasing device leakage.

Current alternating phase shift masking (PSM) designs for polysilicon layers often focus on enabling gate shrink by applying alternating phase shift regions around the gate region (i.e., the intersection of the polysilicon and active layers). One such alternating PSM design is described in U.S. Pat. No. 5,573,890 entitled METHOD OF OPTICAL LITHOGRAPHY USING PHASE SHIFT MASKING, by Christopher A. Spence (one of the inventors of the present application) and assigned to the assignee of the present application.

An enhanced phase shift approach was developed to reduce the transition regions and move those regions away from the active edge to wider poly or corners of poly patterns where linewidth loss would have little or no impact. Examples of this enhanced phase shifting approach are described in U.S. patent application Ser. No. 09/772,577 entitled PHASE SHIFT MASK AND SYSTEM AND METHOD FOR MAKING THE SAME, filed on Jan. 30, 2001, by Todd P. Lukanc (one of the inventors of the present application) and assigned to the assignee of the present application, incorporated herein by reference, now U.S. Pat. No. 6,534,224.

The specification of the Lukanc patent application describes binary and phase masks that define parts of the poly pattern and need to have very controlled critical dimensions (CDs). The phase mask basically has long narrow openings that are easy to pattern but the binary mask has both small openings as well as small lines, in both isolated and dense areas. As such, the patterning of the binary mask can be complicated and the manufacturing window of this technique can be limited. In both the simple phase and the enhanced phase methods, both masks are critical and have different optimized illumination and patterning conditions.

Other known systems use a "node" based approach rather than a gate-specific approach to generate a phase assignment that attempts to apply phase shifting to all minimum poly geometries (both field and gate). Two examples of the "node" based approach include, for example, Galan et al. "Applications of Alternating-Type Phase Shift Mask to Polysilicon Level for Random Logic Circuits," Jpn. J. Appl. Phys. Vol. 33 (1994) pp. 6779–6784, December 1994, and U.S. Pat. No. 5,807,649 entitled LITHOGRAPHIC PATTERNING METHOD AND MASK SET THEREFOR WITH LIGHT FIELD TRIM MASK, by Liebmann et al.

In view of the known art, there is a need for improvements to the clear field phase shifting mask (PSM) and field or trim mask approach that result in simpler and more reliable mask fabrication and in better wafer imaging. Further, there is a need to minimize variations or use of optical proximity correction (OPC) by enclosing phase shift masking features. Yet further, there is a need to generate phase shifting patterns to improve the patterning of gates and other layers needing sub-nominal dimensions.

SUMMARY OF THE INVENTION

The present invention is related to a technique in which a boundary region is added to the ends of phase zero (0) pattern defining polygons as well as to outside edges of phase 180 regions. This technique can improve line end pattern definition and improve the manufacturability and patterning process window. The added boundary region makes mask inspection easier, defines the phase etch region with chrome, balances coma and other patterning issues, and balances the light on both sides of the line ends, resulting in a more predictable final resist pattern.

An exemplary embodiment is related to a method of designing a phase shift mask. This method can include identifying edges of a first phase region of a phase shifting mask, expanding the identified edges to define a narrow line along the edges of the first phase region, and forming a phase region boundary in the narrow line along the edges of the first phase region. The first phase region is located proximate a critical poly region and the identified edges are not edges of the first phase region adjacent to the critical poly region.

Another exemplary embodiment is related to a method of generating phase shifting patterns to improve the patterning of gates and other layers needing sub-nominal dimensions. This method can include defining critical gate areas, creating phase areas on either side of the critical gate areas, assigning opposite phase polarities to the phase areas on either side of the critical gate areas, enhancing phase areas with assigned phase polarities, defining break regions where phase transitions are likely to occur, generating polygons to define other edges and excluding the defined break regions, and constructing a boundary region outside of phase 0 regions to form a phase shift border.

Another exemplary embodiment is related to a method of enhancing clear field phase shift masks with a chrome border around outside edges of phase 0 and phase 180 regions. The method can include assigning phase polarities to phase areas where the phase areas include first phase areas and second phase areas, defining edges of the assigned phase areas, establishing a first boundary around the defined edges of the first phase area, forming a chrome border in the first boundary around the first phase area, establishing a second boundary around the added edges of the second phase area, and forming a phase shift border in the second boundary around the second phase area.

Another exemplary embodiment relates to a mask configured for use in an integrated circuit manufacturing process. This mask can include a critical poly section defined by first edges of a phase zero region and first edges of a phase 180 region, a first chrome boundary region located outside second edges of the phase 180 region, and a second chrome boundary region around second edges of the phase 0 region. The second edges of the phase 180 region are different than the first edges of the phase 180 region, wherein the chrome boundary region includes an opaque material. The second edges of the phase 0 region are different than the first edges of the phase 0 region.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
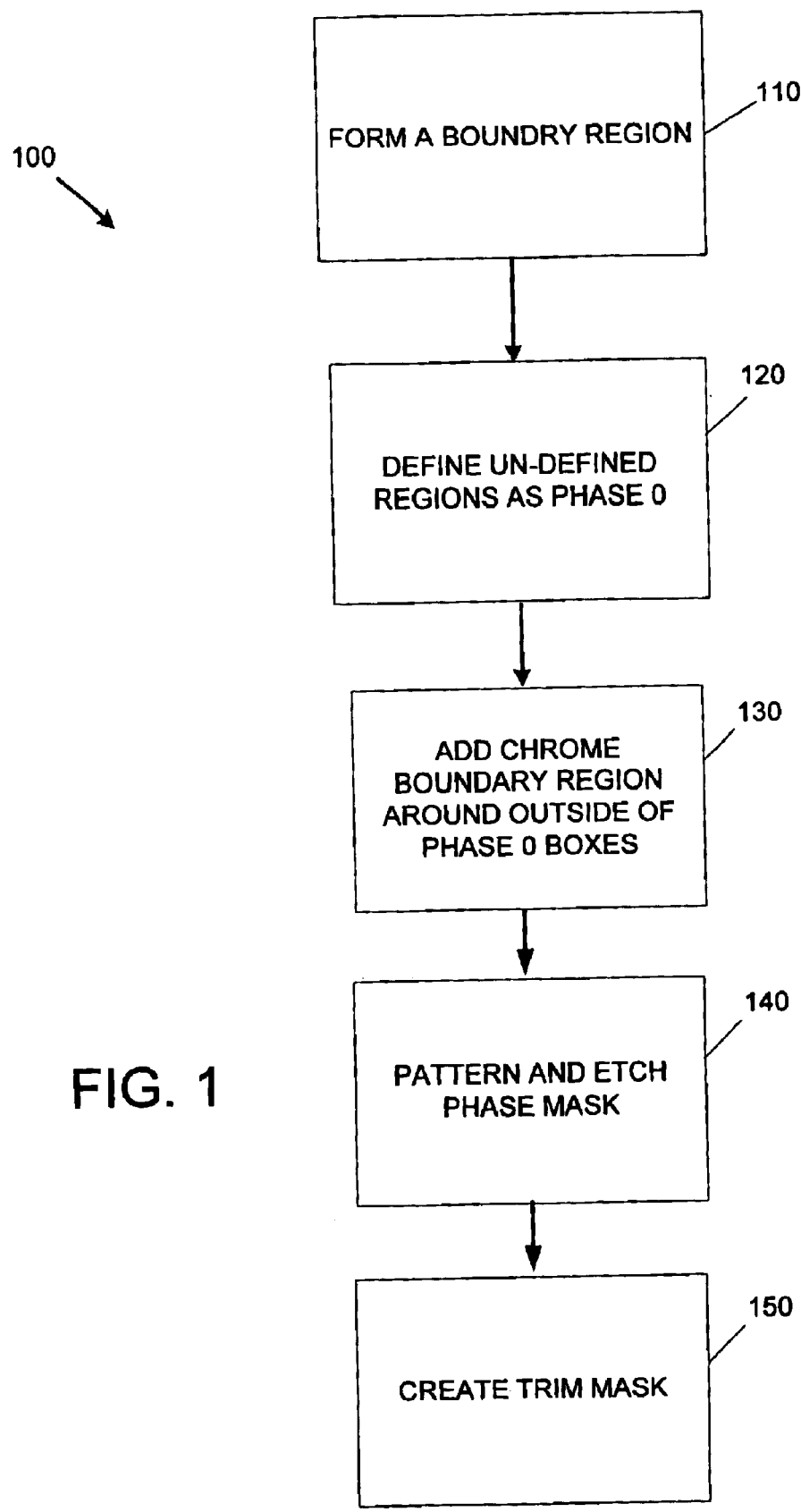
FIG. 1 is a flow diagram illustrating steps in a method of forming a phase shift mask according to an exemplary embodiment.

FIG. 1 illustrates a flow diagram 100 depicting exemplary steps in the formation or design of a phase shifting mask (PSM) and a field or trim mask. A set of previously defined phase 0 or phase 180 regions on a phase mask help identify a critical poly section. These phase 0 or phase 180 regions can be created by hand drawing, by using a currently available software program, or by creating an optimized program to define the regions.

In a step 110, a chrome boundary region is formed on the phase mask outside phase 180 region edges of the previously defined phase 180 regions that are not defining a final poly pattern. This chrome boundary region can be defined by either hand drawing or by using a computer software program. Advantageously, this chrome boundary region makes it easy to inspect the mask, and easy to pattern the phase etch step of making the mask. In a step 120, all regions not defined (either as the final poly pattern or phase 180 regions or chrome boundary regions) are defined as phase 0.

In a step 130, a chrome boundary region is added around the outside of the initially defined phase 0 regions proximate the critical poly sections. Adding such a chrome boundary region helps to minimize patterning issues.

In a step 140, the chrome is patterned and etched on the mask. As part of the chrome defining process or after the chrome is patterned, a layer of resist is coated and sections of the resist are selectively removed in areas where phase 180 sections are to be formed. In an exemplary embodiment, an oversized phase 180 pattern, or a phase etch region, is defined to allow the resist to be removed and the quartz to be etched. This oversized resist pattern covers any openings in the chrome where it is desired to avoid etching. A dry or wet etch can be used to etch the quartz to a lesser thickness in the formation of the phase 180 regions. The formation of phase 180 sections and phase etch regions are further described with reference to FIG. 2.

In a step 150, the trim mask is formed to have openings that are oversized versions of the boundary chrome regions outside the final poly pattern. The openings of the trim mask are oversized because their size is slightly larger in area than the boundary regions. In the trim masking process, the openings of the trim mask are placed over these slightly smaller boundary regions. An exemplary trim mask is described with reference to FIG. 3.

Figure 2:
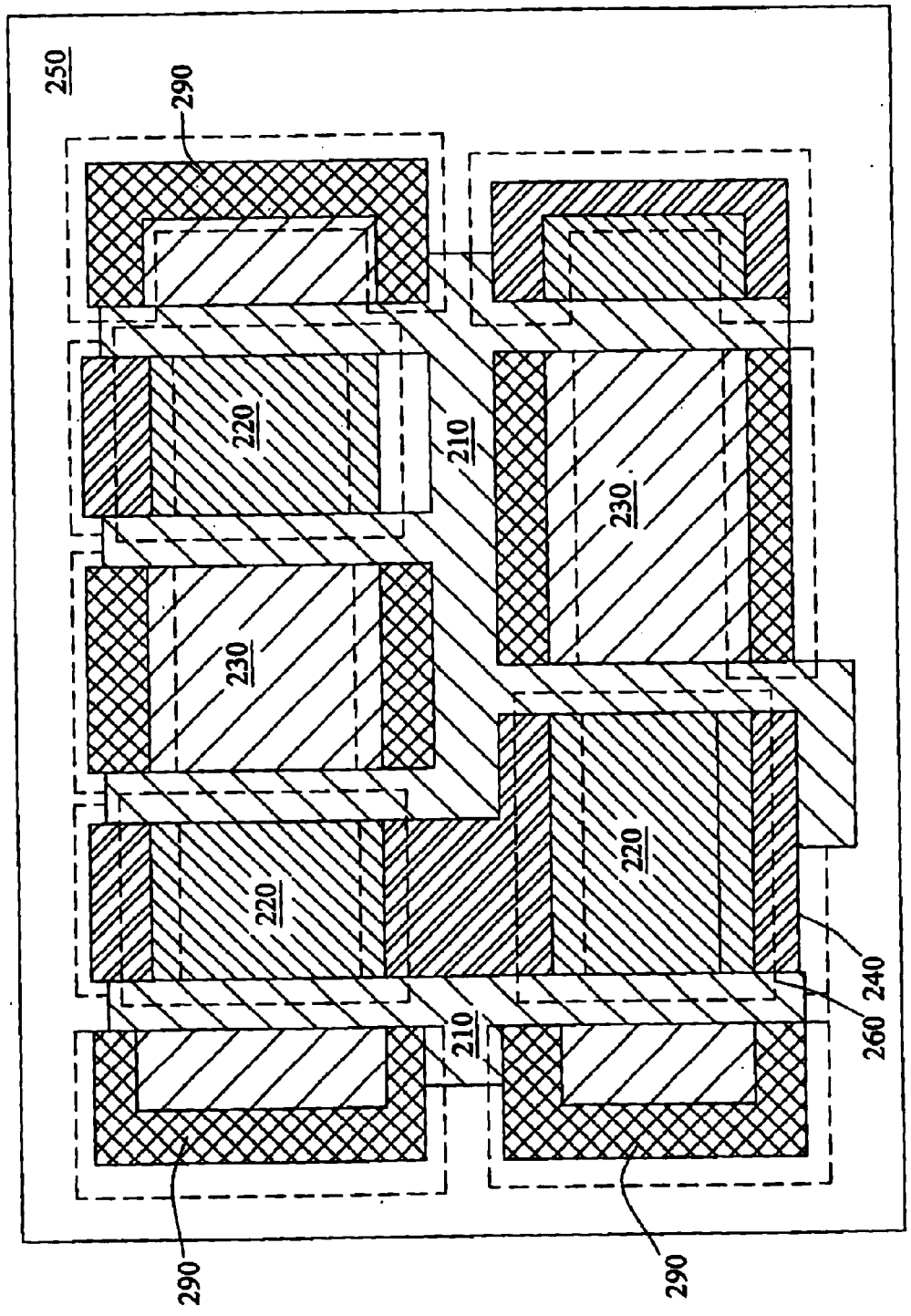
FIG. 2 is a top planar view of a phase shift mask design in accordance with an exemplary embodiment.

FIG. 2 illustrates a plan view of a phase mask 200 formed or designed utilizing the process described with reference to FIG. 1. Phase mask 200 includes poly regions 210, phase 180 regions 220, phase 0 regions 230, and phase 180 boundary regions 240. Poly regions 210 (depicted in FIG. 2 as cross-hatched areas) are critical poly sections. Phase 180 regions 220 and phase 0 regions 230 help to define poly regions 210 and can be created by hand or using a computer software program configured for the designing of phase masks. Phase 180 boundary regions 240 can be formed outside edges of defined phase 180 regions 220 that are not defining the poly pattern.

Phase mask 200 also can include a region 250 outside of defined areas. In an exemplary embodiment, region 250 (depicted in FIG. 2 without hashing) is assigned a phase of zero.

Phase etch boxes 260 (depicted in FIG. 2 using a bold dashed line) are areas that define a pattern used in the formation of phase 180 regions 220. Advantageously, the positions of phase etch boxes 260 are self-aligned to the chrome pattern as to avoid misplacement of the etch pattern relative to the original chrome pattern. In an alternative embodiment, it is possible to make the etch profile such that it partially goes underneath the chrome to partially hide the etch profile. The partially hidden etch profile allows for some variation in sidewall profiles.

Trim mask openings 270 (depicted in FIG. 2 using a dotted line) define an area that is exposed when the field or trim mask is applied. An exemplary trim mask corresponding to trim mask openings 270 is described with reference to FIG. 3.

Phase mask 200 can also include chrome boundary regions 290 around the outsides of phase 0 regions 230. A trim mask corresponding to phase mask 200 can include an oversize of all chrome regions outside the final poly pattern.

Figure 3:
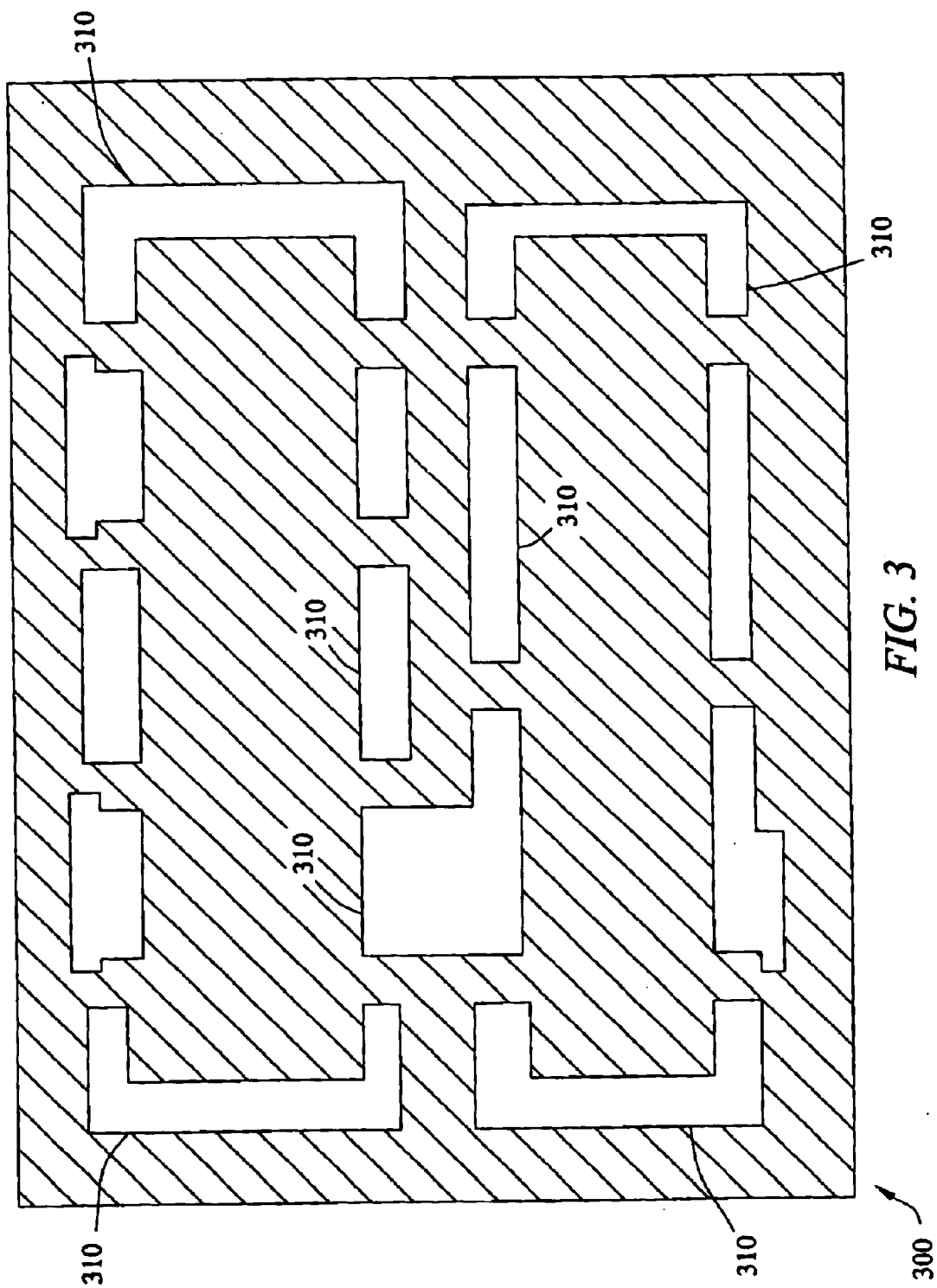
FIG. 3 is a top planar view of a field or trim mask design configured for use with the phase shift mask design of FIG. 2 in accordance with an exemplary embodiment.

FIG. 3 illustrates a plan view of a field or trim mask 300. Trim mask 300 is configured for use with phase mask 200 described with reference to FIG. 2. Trim mask 300 includes openings 310 corresponding to trim mask opening 270 in FIG. 2.

Figure 4:
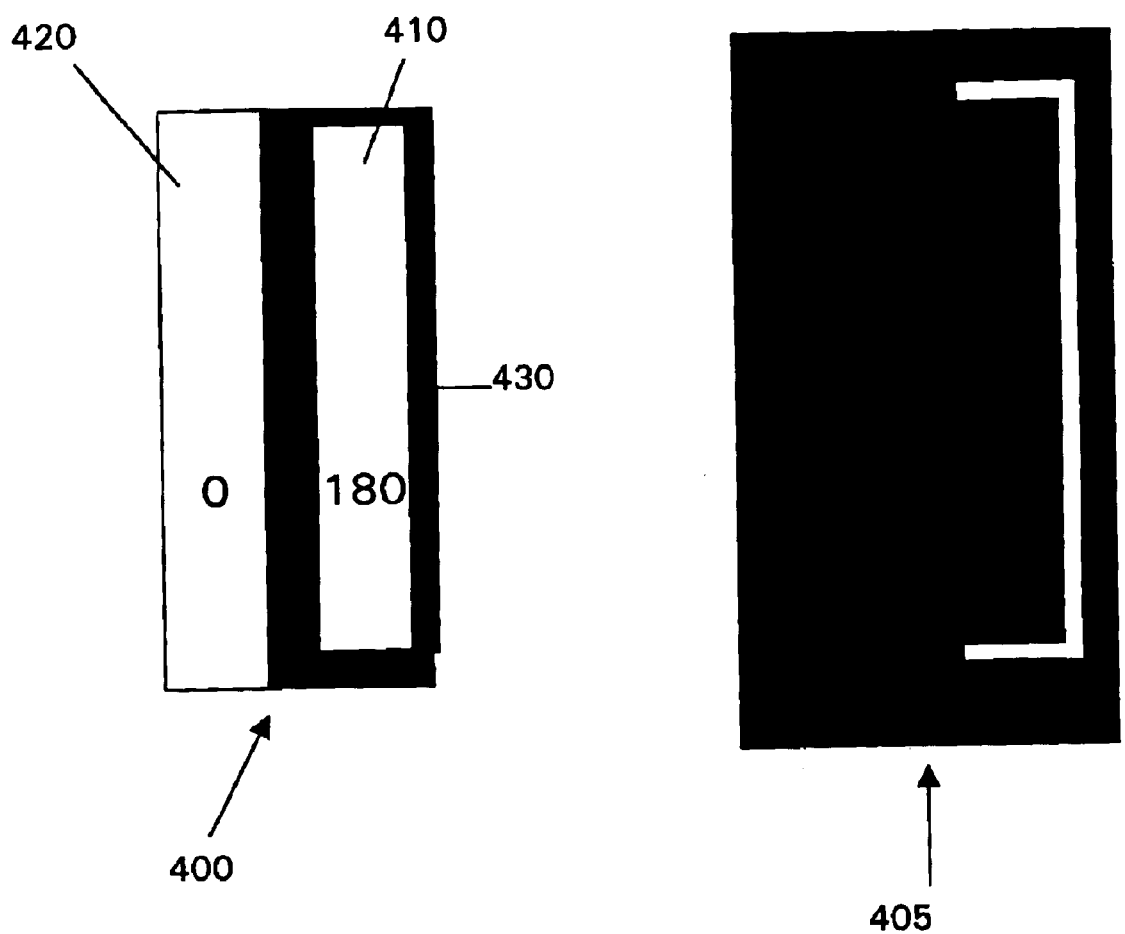
FIG. 4 is a block illustration of a portion of a poly line separating a phase 180 region and a phase 0 region and a corresponding trim mask in accordance with an exemplary embodiment.

FIG. 4 illustrates a poly line mask 400 and a trim mask 405. Poly line 400 separates a phase 180 region 410 and a phase 0 region 420. A chrome boundary 430 is located along edges of phase 180 region 410. Chrome boundary 430 can improve mask generation by allowing a chrome mask to fully define the quartz etch. Configured as such, however, poly line mask 400 is asymmetric and has a risk of bridging between adjacent lines.

Figure 5:
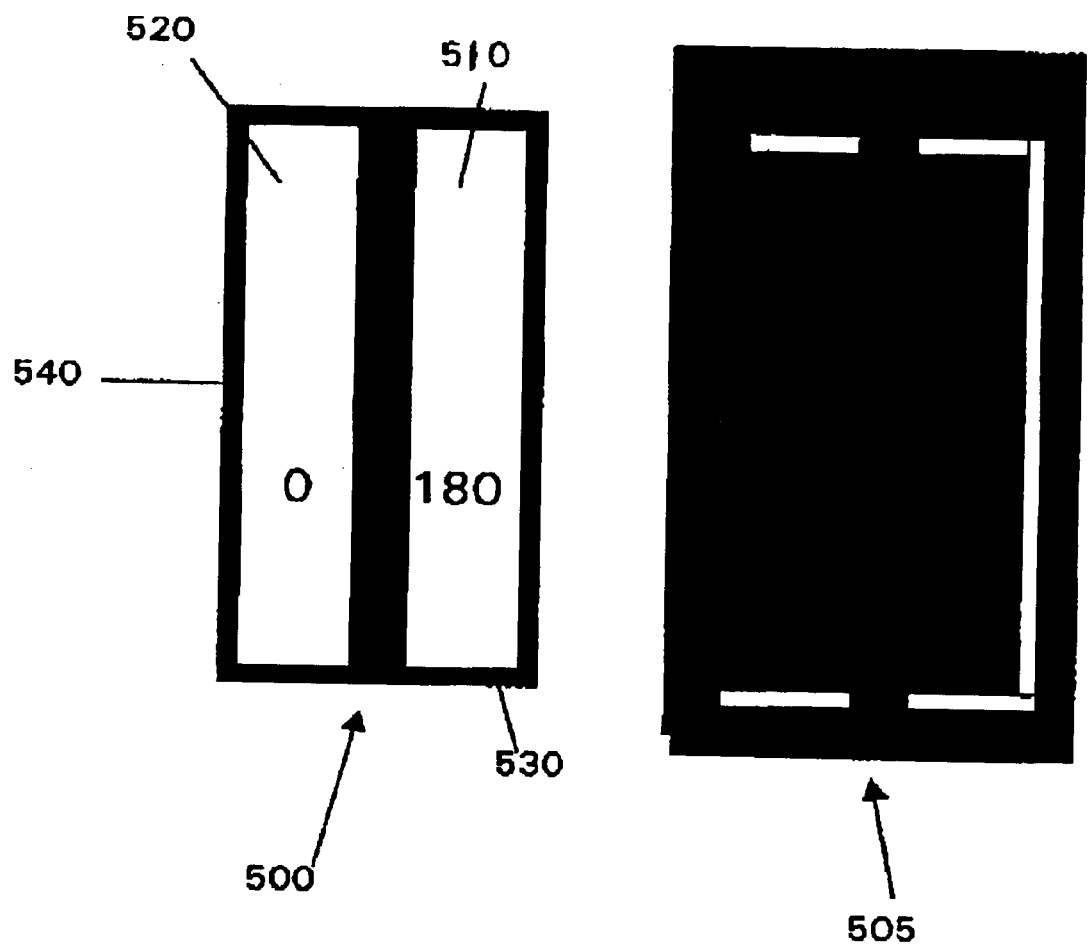
FIG. 5 is a block illustration of a portion of a poly line separating a phase 180 region and a phase 0 region and a corresponding trim mask in accordance with an exemplary embodiment.

FIG. 5 illustrates a poly line mask 500 and a trim mask 505. Poly line mask 500 separates a phase 180 region 510 and a phase 0 region 520. A chrome boundary 530 is located along edges of phase 180 region 510. A phase region 540 is located along edges of phase 0 region 520. By placing phase region 540 or dummy lines at the edges of the phase 0 region, symmetry is enhanced and, therefore, wafer patterning can be improved.

Exemplary materials for chrome boundary 530 can include any material of opaque qualities. Alternatively, other suitable opaque materials can be utilized for boundary 530, such as any material known to a person of skill in the art to satisfy necessary phase requirements. Chrome boundary 530 can have a width of approximately a minimum gate width dimension or the width between phase 0 and phase 180 regions where the critical gates are formed.

Advantageously, the process described with reference to the FIGURES improves gate width control, line end pattern definitions, and the patterning process window. Moreover, the process can make the critical piece of the trim mask similar to that of the phase mask, namely a relatively narrow opening in the chrome mask (or a trench). Making the critical piece of trim mask similar to the phase mask has an advantage of making the optimized illumination conditions of the phase mask more similar to or the same as the trim mask. By doing this, the stepper does not have to change settings (e.g., numerical aperture or partial coherence or focus or exposure dose).

While the exemplary embodiments illustrated in the FIGURES and described above are presently preferred, it should be understood that these embodiments are offered by way of example only. Other embodiments may include, for example, different techniques for creating phase shifting regions. Furthermore, other embodiments may use phase angles other than 0 and 180 while still having a difference of 180. The invention is not limited to a particular embodiment, but extends to various modifications, combinations, and permutations that nevertheless fall within the scope and spirit of the appended claims.

What is claimed is:

1. A method of designing a phase shift mask, the method comprising:

identifying edges of a first phase region of a phase shifting mask, the first phase region being located proximate a critical poly region and the identified edges not being edges of the first phase region adjacent to the critical poly region;

expanding the identified edges to define a narrow line along the edges of the first phase region; and forming a phase region boundary in the narrow line along the edges of the first phase region.

2. The method of claim 1, further comprising:

identifying edges of a phase 180 region of a phase shifting mask, the phase 180 region being located proximate a critical poly region and the identified edges not being edges of the phase 180 region adjacent to the critical poly region;

expanding the identified edges to define a narrow line along the edges of the phase 180 region; and forming chrome in the narrow line to form a chrome boundary along the edges of the phase 180 region.

3. The method of claim 1, further comprising:

assigning phase polarities to phase regions;

defining edges of the assigned phase regions;

establishing a boundary around the added edges; and assigning area outside of the established boundary to have phase zero.

4. The method of claim 3, wherein the phase areas are assigned a phase angle of either 0 or 180.

5. The method of claim 4, further comprising generating a trim mask to remove undesired patterns between phase 0 and phase 180 regions.

6. The method of claim 1, wherein the narrow line has a width of a minimum gate width dimension.

7. The method of claim 1, further comprising defining a boundary around edges of a second phase region, wherein the edges are not adjacent the critical poly region.

8. The method of claim 7, wherein defining the boundary includes defining a boundary around edges having phase 0.

9. The method of claim 1, further comprising defining break locations where phase transitions are most likely to occur.

10. The method of claim 9, wherein the break locations have a width that permits patterning and inspection.

11. The method of claim 1, further comprising generating a trim mask to remove undesired patterns between first and second phase regions.

12. A method of generating phase shifting patterns to improve the patterning of gates and other layers needing sub-nominal dimensions, the method comprising:

defining critical gate areas including critical gate area edges;

creating phase areas on either side of the critical gate areas, the phase areas having first edge, the first edges being different than the critical gate area edges;

assigning opposite phase polarities to the phase areas on either side of the critical gate areas;

enhancing phase areas with assigned phase polarities;

defining break regions where phase transitions are likely to occur;

generating polygons to define other edges and excluding the defined break regions; and constructing a boundary region along the first edges to form a phase region boundary.

13. The method of claim 12, further comprising:

correcting design rule violations; and applying optical proximity and process corrections to phase regions to allow proper pattern generation.

14. The method of claim 12, further comprising generating a trim mask to remove undesired patterns between phase 0 and phase 180 regions outside of a desired pattern.

15. The method of claim 14, wherein the generating is done by oversizing boundary and break regions.

16. The method of claim 14, wherein the chrome border has a width of a distance between phase 0 and phase 180 regions.

17. A method of enhancing clear field phase shift masks with a chrome border around outside edges of phase 0 and phase 180 regions, the method comprising:

assigning phase polarities to phase areas, the phase areas including first phase areas and second phase areas;

defining first edges of the assigned phase areas, the first edges being edges of a critical poly region;

establishing a first boundary around the defined added edges of the first phase area, the added edges being different than the first edges;

forming a chrome border in the first boundary around the first phase area;

establishing a second boundary around the added edges of the second phase area; and forming a phase shift border in the second boundary around the second phase area.

18. The method of claim 17, wherein adding edges to the assigned phase areas includes defining break regions where phase transitions occur and generating polygons including edges but excluding break regions, wherein the polygons are merged with the assigned phase areas.

19. The method of claim 17, further comprising generating a trim mask to remove undesired patterns between the first and second phase areas.

20. The method of claim 19, wherein the trim mask does not cover all or any of the phase shift border in the second boundary around the second phase area.

21. The method of claim 19, wherein the generating is done by oversizing the boundary and break regions.

22. A mask configured for use in an integrated circuit manufacturing process, the mask comprising:

a critical poly section defined by first edges of a phase zero region and first edges of a phase 180 region;

a first chrome boundary region located outside second edges of the phase 180 region, the second edges of the phase 180 region being different than the first edges of the phase 180 region, wherein the chrome boundary region includes an opaque material; and a second chrome boundary region around second edges of the phase 0 region, the second edges of the phase 0 region being different than the first edges of the phase 0 region.

23. The mask of claim 22, further comprising a region outside of defined areas having a phase of zero.

24. The mask of claim 22, wherein the second boundary region includes an opaque material.

* * * * *